United States Patent [19]

Schinella et al.

[11] 3,919,005

[45] Nov. 11, 1975

[54] METHOD FOR FABRICATING DOUBLE-DIFFUSED, LATERAL TRANSISTOR

[75] Inventors: Richard D. Schinella, Mountain View; Michael P. Anthony, San Carlos, both of Calif.

[73] Assignee: Fairchild Camera and Instrument Corporation, Mountain View, Calif.

[22] Filed: July 1, 1974

[21] Appl. No.: 484,831

Related U.S. Application Data

[62] Division of Ser. No. 357,968, May 7, 1973, Pat. No. 3,873,989.

[52] U.S. Cl. .................... 148/175; 29/578; 148/1.5; 148/187; 148/189; 148/190; 357/35; 357/38; 357/44; 357/48; 357/50

[51] Int. Cl.²H01L 21/22; H01L 21/26; H01L 21/76

[58] Field of Search ........... 148/175, 187, 189, 190; 29/578; 357/35, 38, 44, 48, 50

[56] References Cited

UNITED STATES PATENTS

| | | | |
|---|---|---|---|
| 3,328,214 | 6/1967 | Hugle | 148/175 |
| 3,390,025 | 6/1968 | Strieter | 148/187 |
| 3,397,449 | 8/1968 | Jenny | 29/578 |
| 3,411,051 | 11/1968 | Kilby | 357/48 |
| 3,473,979 | 10/1969 | Haenichen | 148/187 |
| 3,542,551 | 11/1970 | Rice | 148/187 UX |
| 3,560,278 | 2/1971 | Sanera | 148/187 |
| 3,623,923 | 11/1971 | Kennedy et al. | 148/175 |
| 3,648,125 | 3/1972 | Peltzer | 357/50 |
| 3,713,008 | 1/1973 | Dorendorf | 357/38 |

*Primary Examiner*—L. Dewayne Rutledge
*Assistant Examiner*—W. G. Saba
*Attorney, Agent, or Firm*—Alan H. MacPherson; Norman E. Reitz

[57] ABSTRACT

A double-diffused, lateral transistor structure is fabricated utilizing an etch resistant mask to provide self-aligning positional accuracy for formation of active areas of the transistor. The lateral structure includes semiconductor material having at least one substantially flat surface, and the structure includes at least one region of insulating material formed adjacent the flat surface, the top surface of the insulating material being substantially coplanar with said one surface. A collector is formed in the semiconductor material adjacent first portions of both the flat surface and the insulating material, while an emitter is formed in the semiconductor material adjacent second portions of both the flat surface and the insulating material. A base separates the collector from the emitter.

3 Claims, 24 Drawing Figures

METHOD FOR FABRICATING DOUBLE-DIFFUSED, LATERAL TRANSISTOR

This is a division of application Ser. No. 357,968, filed May 7, 1973, now U.S. Pat. No. 3,873,989, on an invention of Richard D. Schinella and Michael P. Anthony entitled METHOD FOR FABRICATING DOUBLE-DIFFUSED, LATERAL TRANSISTORS AND THE RESULTING STRUCTURE.

BACKGROUND OF THE INVENTION

1. Field of the Invention

This invention relates to semiconductor devices, and in particular to integrated circuits containing lateral transistors of higher speed, smaller size, and higher packing density than those heretofore existing.

2. Prior Art

Lateral transistors are well known and have been employed in integrated circuit technology for some time. See, for example, U.S. Pat. No. 3,571,674 entitled "Fast Switching PNP Transistor" and issued Mar. 23, 1971 to Yu et al. Conventional lateral transistors, however, and in particular PNP lateral transistors, have operated at frequencies much lower than desirable for modern integrated circuits. This relatively low frequency response has been substantially attributed to two factors. First, the relatively large base width of the lateral transistor increases the transit time for minority carriers passing through the base from the emitter. The relatively large base width results principally from the minimum photoresist line width consistently available during manufacture of the devices. Second, for a given amount of base impurity, the uniform base concentration profile further increases the transit time over that achievable in devices having graded base concentration profiles.

Double-diffused vertical transistors are also well known. See, for example, U.S. Pat. No. 3,025,589 entitled "Method of Manufacturing Semiconductor Devices," issued Mar. 20, 1962, to Hoerni and U.S. Pat. No. 3,648,125 entitled "Method of Fabricating Integrated Circuits with Oxidized Isolation and the Resulting Structure" issued Mar. 7, 1972 to Peltzer. The process by which vertical double-diffused transistors are made has several advantages over other processes, such as the mesa process. First, the base width of the transistor can be varied by controlling the diffusion processes, rather than by altering the dimensions of the masks used in the diffusion processes. Second, the concentration profile of the base can be graded; that is, the base impurity concentration at the emitter-base junction can be made greater than the base impurity concentration at the collector-base junction. It is well known that increases in this difference for a given amount of base impurity increase the high frequency response of the transistor. See *Transistor Engineering*, by A. B. Phillips, McGraw-Hill, 1962.

In summary, prior art integrated circuits have included vertical double-diffused NPN and PNP transistors, and lateral NPN and PNP transistors with a uniform concentration of base dopant. Because the frequency response of lateral PNP transistors has been lower than desired, the prior art integrated circuits for applications requiring high frequency response have typically used (1) NPN type lateral transistors, as these are approximately three times faster than PNP type lateral transistors, or (2) complementary double-diffused vertical PNP and NPN devices on the same chip. The first alternative eliminates PNP transistors from many applications where their use would otherwise be beneficial. The second alternative involves the technology of complementary vertical double-diffused transistors — a very complicated technology resulting in many defects in the wafers, and a low yield, high cost product. Additionally, the complementary double-diffused vertical NPN and PNP transistors have large masking tolerances and thus their packing density is lower than desirable.

Accordingly, some objectives of this invention are: (1) to produce double-diffused, lateral transistors capable of higher frequency response than that heretofore obtained with lateral transistors; (2) to fabricate a lateral transistor structure utilizing as simple a process as possible; (3) to make such a structure smaller than existing structures of the same type; and (4) to make such a structure easily adaptable for use in complementary PNP/NPN devices.

BRIEF SUMMARY OF THE INVENTION

At least one active region and at least one region of insulating material are formed in semiconductor material having at least one substantially flat surface. The upper surface of said insulating material is substantially coplanar with the flat surface of said semiconductor material. A collector region is formed adjacent both the flat surface of the semiconductor material and a first portion of the region of insulating material. An emitter region is formed adjacent both the flat surface and a second portion of the region of insulating material. A base region separates the emitter region from the collector region, and this base has a graded impurity concentration.

In some embodiments of this invention the insulating material forms a four-sided closed path surrounding the emitter, base, and collector regions. In some embodiments the emitter will be adjacent one side of the insulating material and the collector adjacent an opposite side. Further, the insulating material may be formed by any one of a number of processes, each well known. For example, see U.S. Pat. No. 3,648,125, cited above.

In one preferred embodiment, the active regions of this invention are formed in the semiconductor material utilizing a mask. This mask is formed upon the flat surface of semiconductor material and overlies portions of what are to be the emitter, base, and collector regions. The mask prevents impurities from reaching underlying semiconductor material, resists thermal oxidation, prevents thermal oxidation of the underlying semiconductor surface, resists attack by many etching solutions, and exhibits a differential etch rate when compared with $SiO_2$. A typical mask material which exhibits the above characteristics is silicon nitride. Silicon nitride etches faster than silicon dioxide in hot phosphoric acid and slower than silicon dioxide in buffered hydrofluoric acid.

In accordance with this invention, a selected portion of the perimeter of the mask performs an alignment function. That is, the selected portions of the perimeter of the mask remain fixed in position on the semiconductor material during many of the process steps required to fabricate the structure of this invention and thereby allows a substantial increase in manufacturing tolerances. This feature allows the manufacture of double-diffused lateral semiconductor devices significantly smaller than those of the prior art.

DETAILED DESCRIPTION

Figure 1A:
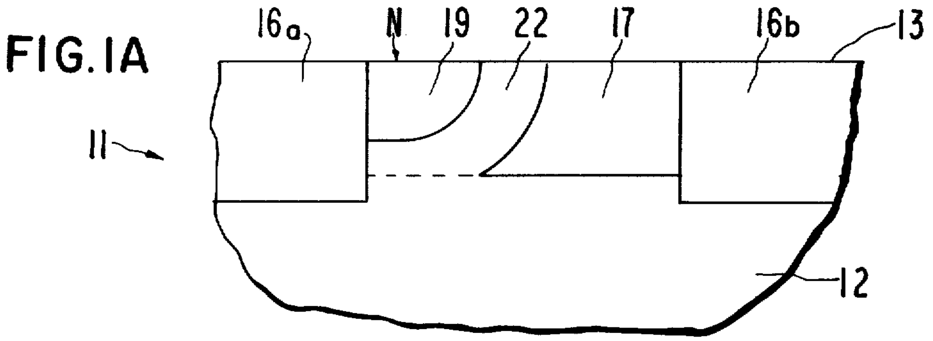
FIGS. 1A and 1B show the double-diffused lateral transistor of this invention and a typical concentration profile for such a structure, respectively.

FIG. 1A shows a double-diffused, lateral transistor structure 11. Semiconductor material 12 having a substantially flat surface 13 is subdivided into regions of active and passive material by insulating material 16. Insulating material 16 (of which cross-sections 16A and 16B are shown) is typically formed by removing part of the semiconductor material 12 overlying the field of the semiconductor device, and oxidizing the remaining semiconductor material as disclosed in the above-mentioned U.S. Pat. No. 3,648,125. However, other techniques may also be used to form insulating material 16. Insulating material 16 is an integral part of the semiconductor wafer 11. A feature of this invention is that the top surface of insulating material 16 is preferably substantially coplanar with the top surface 13 of semiconductor material 12.

A collector region 17 is formed adjacent to both the flat surface and a portion of insulating material 16. A base region 22 is formed in this collector region 17 by diffusion or by ion implantation, for example. In accordance with this invention, emitter region 19 is formed in base region 22 adjacent another portion of insulating material 16 and adjacent surface 13.

Each of the emitter 19, base 22 and collector 17 regions is adjacent the flat surface 13, and the base region 22 separates the emitter region 19 from the collector region 17. Insulating region 16 serves to partially isolate the active region of the transistor 11 shown in FIG. 1A from any other active devices formed in semiconductor material 12. Typically, regions 16A and 16B will be connected to each other, and will form a continuous closed path abutting surface 13 and surrounding the active region of transistor 11 but leaving exposed the top surface of the active region. In addition, in some situations semiconductor material 12 will extend beneath insulation 16 to contact the bottom portions of other active regions formed in material 12.

Figure 1B:
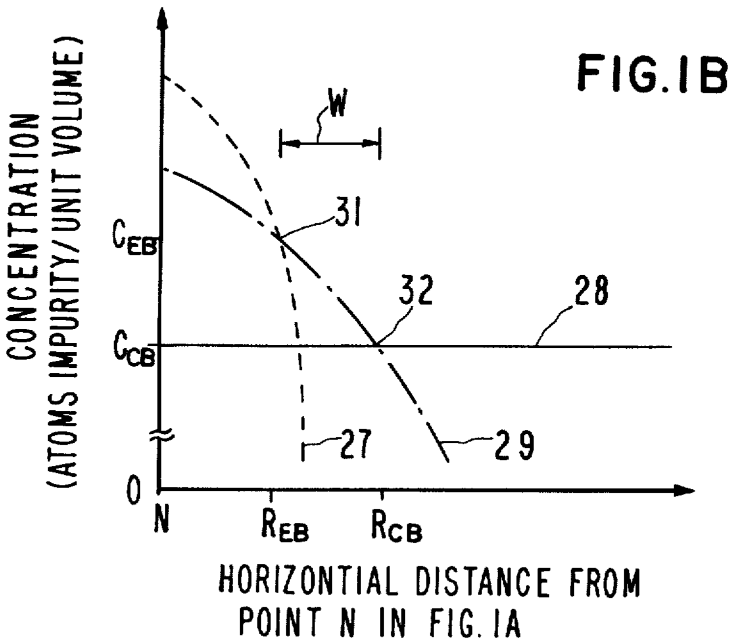

FIG. 1B shows a concentration profile for the transistor structure 11 shown in FIG. 1A when the base and emitter regions of this transistor are produced by diffusion processes. The lateral transistor structure of this invention, which has a graded base, can be formed using ion implantation techniques as well as diffusion techniques. The concentration level 28 of collector 17 is shown as a horizontal line, while the impurity concentration of the base 22 is represented by line 29, and the impurity concentration of the emitter 19 by line 27. The emitter-base junction occurs at point 31 corresponding to concentration level $C_{EB}$ and distance $R_{EB}$. The collector-base junction occurs at point 32 and corresponds to concentration level $C_{CB}$ and distance $R_{CB}$. The distance W between $R_{EB}$ and $R_{CB}$ is known as the base width, while the slope of a straight line connecting points 31 and 32 is called the grade constant $\alpha$ and is defined as $\alpha = (C_{EB} - C_{CB})/W$. It is well known that reductions in W improve the high frequency performance of the transistor, as do increases in the grade constant for a given amount of impurity in the base region. This invention utilizes both of these effects to improve the high frequency performance of lateral transistor structures over that heretofore obtained.

Figure 2:
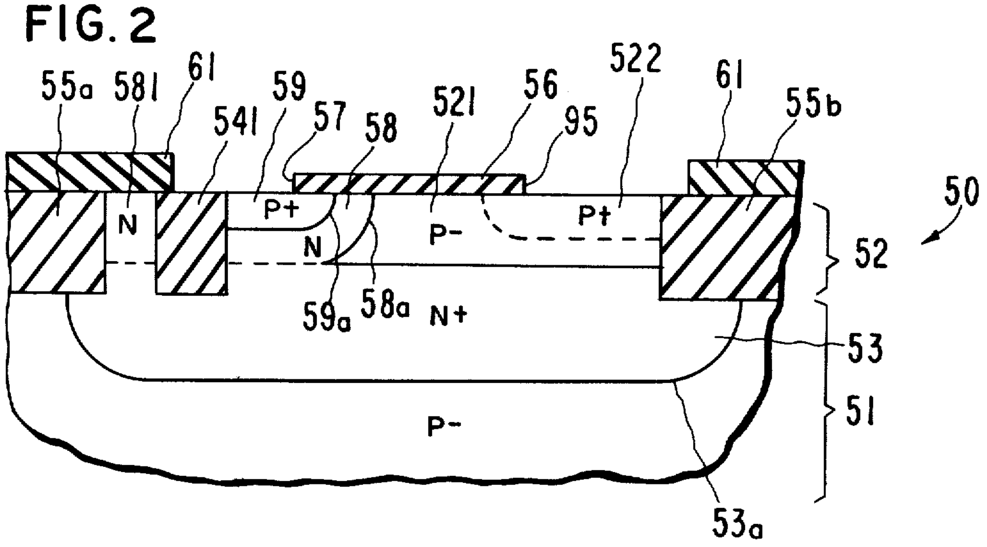
FIGS. 2 and 3 show cross-sectional and top views, respectively, of one embodiment of this invention comprising a double-diffused, lateral transistor structure fabricated utilizing oxide isolation and a self-aligning mask 56 together with a photoresist mask 61 used for forming the emitter.

FIG. 2 shows a double-diffused lateral transistor structure fabricated utilizing the isolation technique of Peltzer (U.S. Pat. No. 3,648,125, previously cited) and a self-aligning mask. This lateral transistor structure will be discussed for a PNP transistor; however, the discussion is made equally applicable to NPN transistors by merely reversing the conductivity type of the materials involved.

Employing Peltzer's technique, an N+ type buried layer 53 is formed at a selected location in P− type substrate 51. Then a P− type epitaxial layer 52 is formed on substrate 51. Hereinafter, substrate 51 and any attached layers of material will be called wafer 50. The PN junction 53*a* between substrate 51 and N type buried layer 53 terminates at field oxide isolation regions 55A and 55B. When reverse biased, this PN junction together with insulating material 55 forms a pocket in the wafer and isolates active devices within the pocket. On the surface of P− type epitaxial layer 52 is deposited a self-aligning mask 56. This mask prevents diffusion of impurities into P− type epitaxial material 52 throughout the regions it overlies. As will be discussed, however, active semiconductor devices may still be formed underneath mask 56 because impurities may diffuse laterally beneath its edges, for example, edge 57.

As shown in FIG. 2 the base region 58 and emitter region 59 of the lateral PNP transistor are formed by diffusing the N type base 58 and the P− type emitter 59 laterally into the silicon epitaxial layer 52 beneath edge 57 of mask 56. Mask 56 may be formed from one or more materials; for example, a composite laminate layer of silicon nitride and silicon oxide (typically predominantly silicon dioxide). The choice of individual materials is based on several criteria. First, the mask materials or material must prevent the passage of, or "mask," impurities. Second, the mask material or materials must be electrically non-conductive at the interface with the semiconductor material. Third, the material or materials must resist etching in solutions used to etch compounds of semiconductor material formed by thermal oxidation. These mask materials need not be inert to the etching solution, but must only exhibit a substantially smaller etch rate than the oxide of the semiconductor material. Advantages provided by the mask 56 will be discussed in conjunction with FIG. 3.

The base width of the transistor in FIG. 2 is approximately equal to the difference in distance between the laterally diffused collector-base junction 58A and emitter-base junction 59A. This difference is a function of process parameters and, in general, may be accurately controlled in a well known manner. The effective emitter-base junction area of the semiconductor device is proportional to (1) the depth of emitter-base junction 59A, and (2) the length *e* (see FIG. 3) of that portion of the mask edge 57 under which some of the emitter and base impurities travel, that is, the dimension perpendicular to the plane of the cross-section shown in FIG. 2. A portion 521 (FIG. 2) of P– type epitaxial layer 52 serves as the collector of the PNP lateral transistor. Electrical contact to the collector 521 of the transistor may be made at any suitable location and is shown at 522 in FIG. 2. Emitter region 59 and base region 58 are terminated along isolation wall 541 which typically is formed at the same time isolation region 55 is formed.

Figure 3:
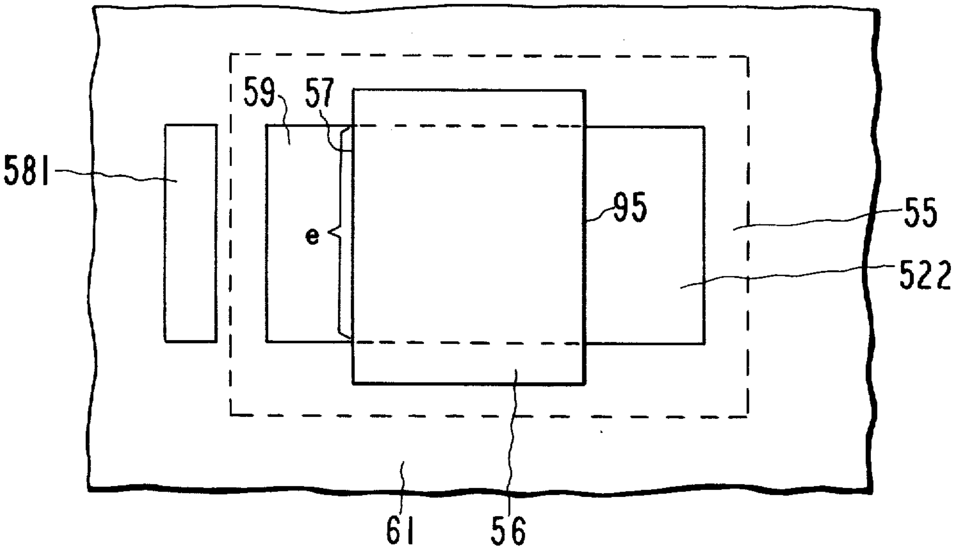

FIG. 3 shows a top view of the double-diffused, lateral, oxide-isolated transistor shown in FIG. 2. The emitter region 59, base contact region 581, and collector contact region 522 are shown, surrounded at the surface of wafer 50 by field oxide insulation 55. Note that a portion of oxide 55 separates base contact 581 from emitter region 59. In one embodiment the self-aligning mask 56 is formed from several materials, including silicon nitride. A photoresist mask 61 is shown by a dashed line in FIG. 3 in position for formation of emitter region 59 and collector contact region 522. For diffusion of the emitter region 59 and collector contact region 522, the area within dashed line 61 is exposed to a mild hydrofluoric acid etch. This removes silicon oxide films from the surface of the silicon within the opening of photoresist mask 61 while not appreciably etching the self-aligning mask 56. The emitter region 59 and the collector contact region 522 are then formed in base region 58 and collector region 521, respectively (see FIG. 2).

The particular self-aligning capability discussed above to make the opening in the photoresist mask 61 expose both insulating material 55 and mask 56 provides this invention with a substantial advantage over the prior art. The location of edges 57, 95 (FIG. 3) of mask 56 determines the location of the base region 58 (FIG. 2), emitter region 59, and collector contact region 522. The dimensions and locations of these regions are not substantially dependent upon the position of the photoresist mask 61. Prior art devices typically depended upon accurate repositioning of photoresist masks to define the locations and sizes of the base and emitter regions. Unlike the prior art, mask 56 is not removed from the wafer 50 and then redeposited later in the manufacturing process. Thus it provides a self-aligning positional accuracy for formation of both the base and emitter regions of the transistor structure. When the base and emitter regions are formed, the positions of the collector-base junction 58A (FIG. 2) and emitter-base junction 59A (FIG. 2) are controlled by the impurity concentrations used in, and the duration of, the processes used to form these regions. Mask 56 typically comprises silicon nitride, at least over its top surface.

Figure 4:
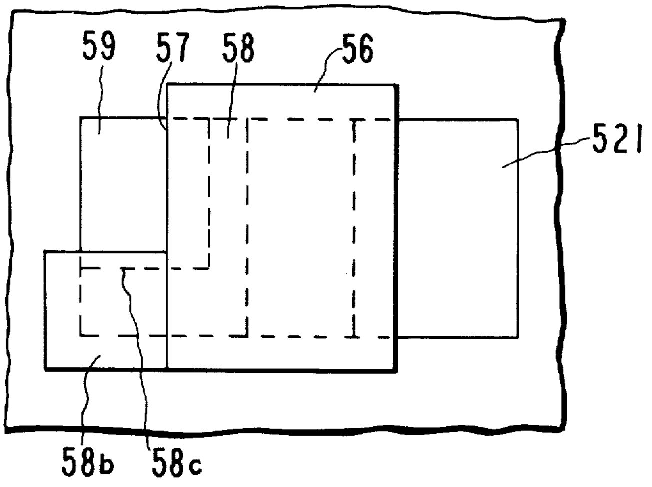
FIG. 4 shows means for making top-side electrical contact with the base region of a structure made in accordance with this invention.

FIG. 4 shows a double-diffused, lateral, oxide isolated transistor with provision for topside contact to base region 58. As shown in FIG. 4 from the top, emitter region 59 no longer extends the full length *e* of edge 57 (FIG. 3) but rather terminates part-way along the edge. Masking material 56 can be given an appendage 58B as shown in FIG. 4. Base region 58 is contacted through a window (not shown) in mask 58B. Emitter 59 and base 58 are shown separated by line 58C. Electrical contact with the emitter is made at region 59 and with the collector at region 521.

Figure 5A:
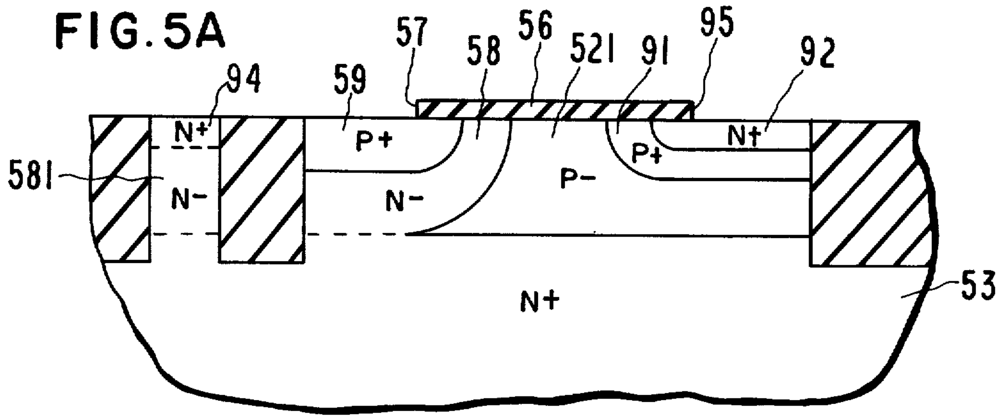
FIG. 5A shows an embodiment of this invention wherein complementary PNP/NPN transistors are formed within the same isolation area.
Figure 5B:
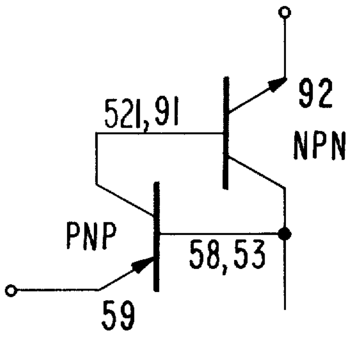
FIG. 5B shows schematically the circuit represented by the structure of FIG. 5A.

FIG. 5A shows a complementary PNP/NPN transistor structure formed within the same isolation area according to one embodiment of this invention. Both devices have graded base impurity concentrations. The PNP transistor structure includes emitter region 59, base region 58, and collector region 521. The NPN transistor structure includes emitter region 92, base regions 91, 521, and collector region 53. Note that the collector region 521 of the PNP transistor structure and base region 91 of the NPN transistor structure are common, as are the PNP base region 58 and the NPN collector region 53. Region 94 is the electrical contact for both the PNP base region 58 and the NPN collector region 53. One means for contact with other regions is shown in FIG. 4 and has already been discussed. FIG. 5B shows the transistor structure of FIG. 5A schematically.

The complementary PNP/NPN transistor structure formed in accordance with this invention provides substantial advantages over the prior art. First, the complementary PNP/NPN structure allows very high packing densities because the addition of the NPN transistor consumes no extra space over that required for just the PNP transistor. This results directly from the formation of a part of the NPN base region 91 and formation of the NPN emitter region 92 approximately at the location which would be the PNP collector contact in a noncomplementary embodiment of the invention. This advantage can readily be seen by comparing FIG. 5A with FIG. 2. Another advantage of the complementary PNP/NPN structure is that it may be formed very simply once the PNP transistor structure is fabricated. Once the PNP structure is formed only one extra manufacturing operation is necessary, that of forming the NPN emitter region 92 and NPN collector region-PNP base region contact 94. Note that the NPN base region 91 is formed at the same time the PNP emitter region 59 is formed. During formation of the NPN base region 91 and NPN emitter region 92 the edge 95 of mask 56 will perform a self-aligning function similar to that described above in conjunction with edge 57 of mask 56.

Figure 5C:
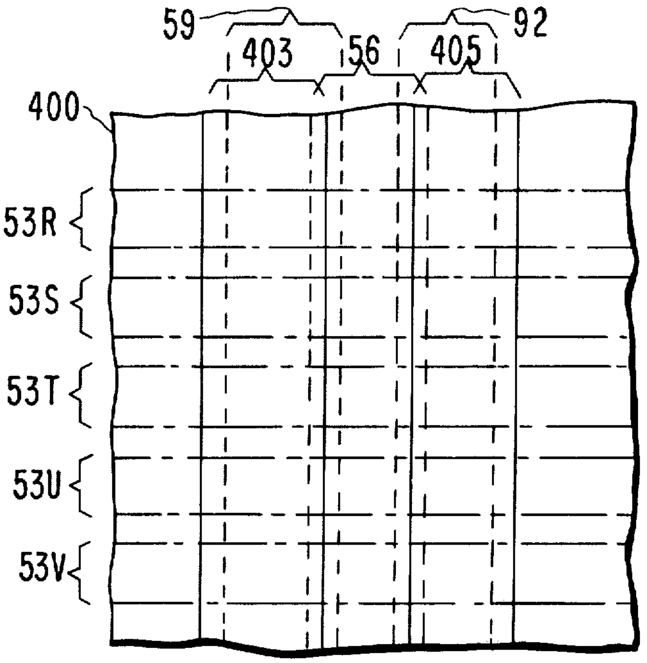
FIG. 5C shows one embodiment of this invention utilizing a plurality of the devices shown in FIG. 5A.

A further advantage of the complementary PNP/NPN transistor structure according to this invention is its compatability for inclusion in semiconductor devices which utilize arrays of complementary transistors. The ease with which arrays of complementary PNP/NPN transistor structures may be formed is shown in FIG. 5C. A portion of a wafer 400 is shown on which a plurality of complementary PNP/NPN transistor structures are formed. In FIG. 5C, five pairs of complementary devices are shown for illustrative purposes only. Each of the devices shown in plan view in FIG. 5C has the cross-section shown in FIG. 5A. A typical embodiment according to this invention employing an array of complementary PNP/NPN transistors may contain any number of such structures, for example, several thousand.

In FIG. 5C the complementary transistor structures are formed at intersections of buried layers 53R–V with other regions formed in the wafer 400. Each of the buried layers 53R–V acts as a common PNP base-NPN collector. Also shown in FIG. 5C are the self-aligned mask 56, PNP emitter region 59, a metal contact 403 to the PNP emitter region 59, NPN emitter region 92, and a metal contact 405 to the NPN emitter region 92. Electrical contacts to other regions of the PNP/NPN complementary structure are not shown in FIG. 5C; however, they could be made at any suitable location on wafer 400. The five pairs of complementary transistor structures are thus formed approximately at the intersections of emitter regions 59, 92 with the top surface of the semiconductor material. The PNP base region and the NPN base region are not shown, however, they separate the PNP emitter and collector regions and the NPN emitter and collector regions.

FIGS. 6A through 6F show one process by which the transistor structure of this invention may be formed. This process will be illustrated for a nonoxide isolated, lateral, double-diffused PNP transistor, although it should be noted the process may be used to form similar NPN structures.

Figure 6A:
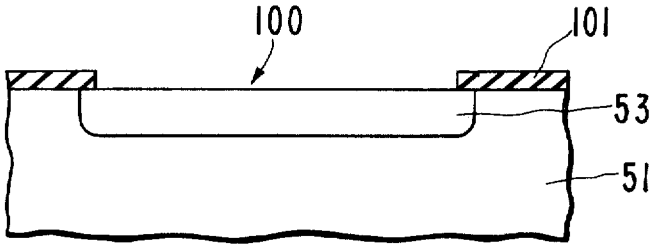
FIGS. 6A through 6F show a first process by which the transistor structure of this invention is formed.
Figure 6B:
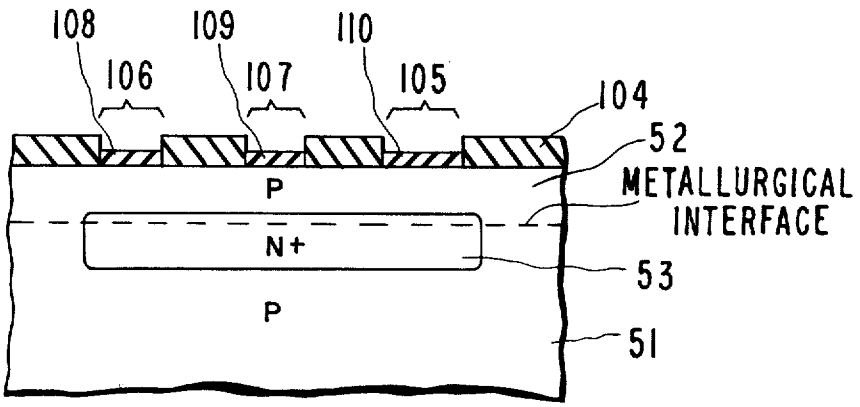
Figure 6C:
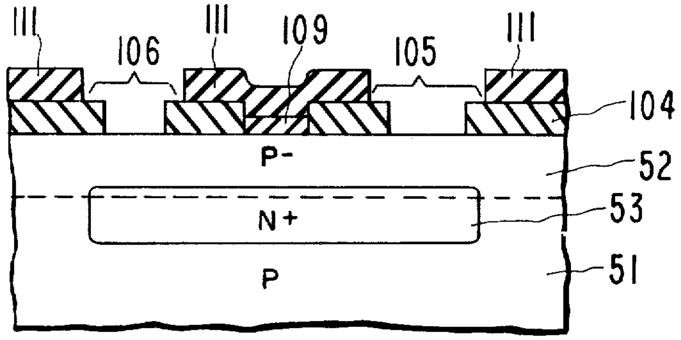
Figure 6D:
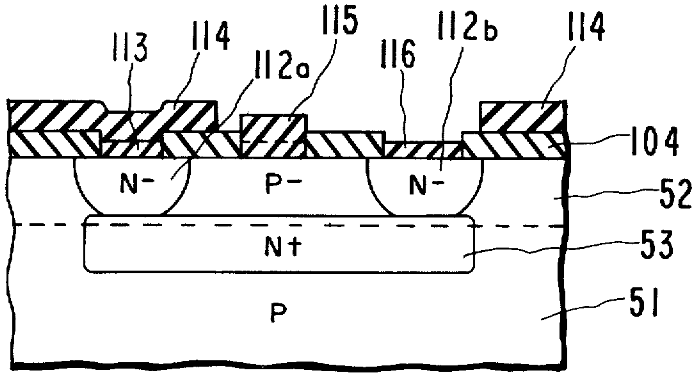

1. Oxidize a P type silicon substrate wafer 51 to form a silicon dioxide impurity diffusion mask (FIG. 6A, layer 101).
2. Form an opening 100 in the silicon dioxide layer 101 where the buried N-type layer is desired.
3. Form the buried layer 53 using an N+ predeposition.
4. Remove the oxide 101 from the surface of the substrate 51.
5. Grow a P type epitaxial layer (FIG. 6B, layer 52).
6. Form a mask 104 on the surface of P type epitaxial layer 52. Mask 104 is comprised of material meeting the specifications set forth herein, and in one embodiment is silicon nitride.
7. Utilizing photo masking techniques, define openings in mask 104 which will be the emitter/base diffusion opening 105, the base contact opening 106, and the collector contact opening 107.
8. Oxidize the wafer to form a silicon dioxide film over the exposed silicon surface. This film will serve as an impurity diffusion mask (layers 108, 109, 110, FIG. 6B).
9. Form the emitter/base mask 111 using well known photoresist material. Note this is an oversize mask, that is, the edges of the mask do not define the openings discussed in step 7 above. Remove oxide 110, 108 from emitter/base region 105 and the base contact region 106 (FIG. 6C).
10. Form the base region predeposition using N-type impurity (not shown).
11. Perform the base diffusion 112 (FIG. 6D) at an elevated temperature, thereby causing the base impurity to contact the N+ buried layer 53 (FIG. 6D). During this operation silicon dioxide films 113, 115, 116 are formed.
12. Form the emitter and collector mask 114 using well-known photoresist material. Note this is also an oversized mask. Remove the silicon dioxide 115, 116 shown in FIG. 6D.
13. Form the collector contact 117 and emitter 118 (FIG. 6E) predepositions and oxidize the wafer (layers 119, 120, 121 in FIG. 6E).
14. Remove oxide 119, 120, 121 to allow electric contact to be made to emitter region 118, base region 112A, and collector region 117.

15. Deposit and define metal contacts (122, FIG. 6F).

Figure 6E:
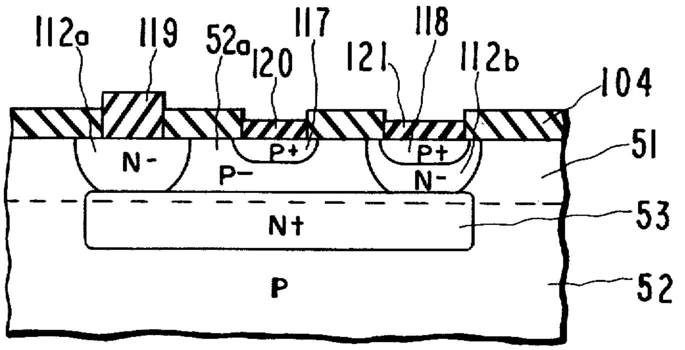
Figure 6F:
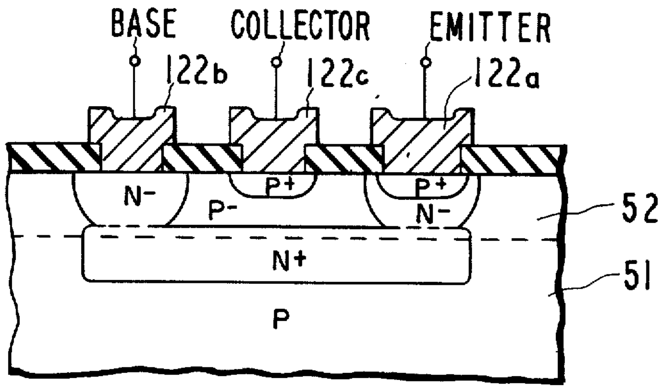

The above-described process uses one masking layer 104 to form the collector, base and emitter regions 52A, 112B and 118, respectively, of a lateral, double-diffused PNP transistor with a graded base. Isolation is provided by backbiasing the PN junction between P regions 51, 52 and N type regions 112A, 112B and 53 (FIG. 6E). Buried layer 53 serves as a low resistance contact to base region 112B. Of interest, if the cross-section shown in FIG. 6F is rotated 360 degrees about a vertical line through the center of the emitter region, a circular structure is obtained with the emitter at the center, surrounded by the base region which in turn is surrounded by the collector region. The low resistivity buried N region underlies the structure and a circular base sink region surrounds the collector. In other words, the cross-section shown in FIG. 6F to the left of a vertical centerline through the center of the emitter region represents the cross-section of one half of a disk-shaped structure.

Figure 7A:
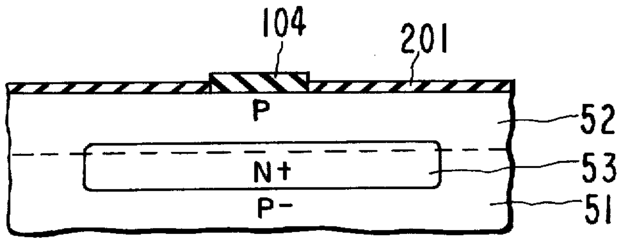
FIGS. 7A through 7I show schematically a second process by which the transistor structure of this invention is formed.
Figure 7B:
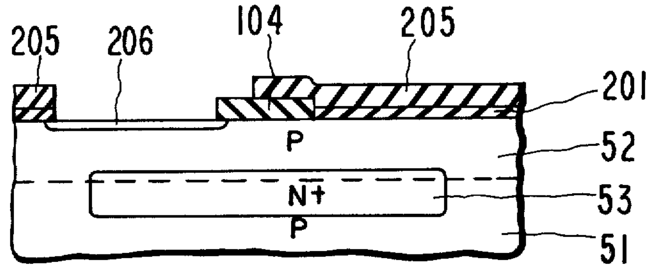
Figure 7C:
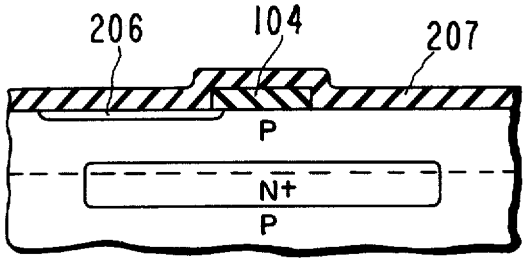
Figure 7D:
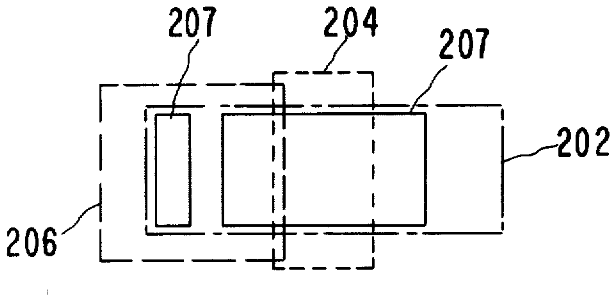
Figure 7E:
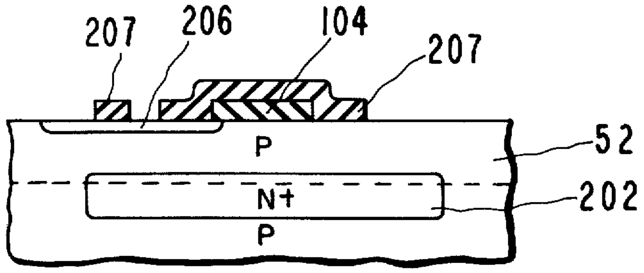
Figure 7F:
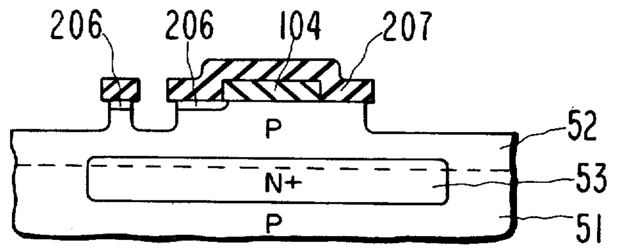
Figure 7G:
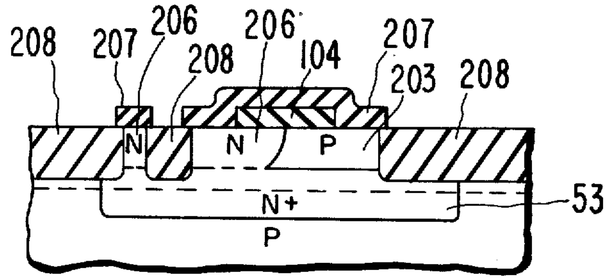
Figure 7H:
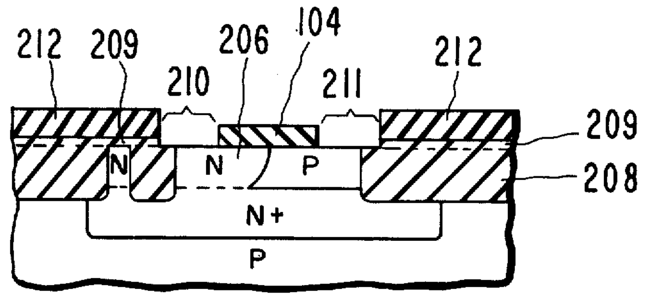

A second process by which the transistor of this invention may be formed utilizes, in part, the process of Peltzer, previously cited herein, to form the isolation regions. This process results in a double-diffused, lateral, oxide-isolated PNP structure. The steps of this process are as follows:

1. Follow steps 1–6 of the first process just discussed.
2. Remove mask 104 from everywhere on the surface of P-type epitaxial layer 52 except where the transistor structure of this invention is desired.
3. Oxidize the wafer to grow an impurity-diffusion masking layer 201 of silicon dioxide (FIG. 7A).
4. Mask the base region using a photoresist mask 205 which overlaps the mask 104. Remove the exposed silicon dioxide.
5. Remove mask 205. Form the base region 206 N-type predeposition into the exposed silicon surface (FIGS. 7B, 7C).
6. Remove the thermal oxide 201 (FIG. 7C).
7. Deposit a second mask of a material with characteristics similar or identical to the material of mask 104, i.e., silicon nitride (FIG. 7C, layer 207).
8. Using photomasking techniques, define mask 207 into islands as described in Peltzer (FIG. 7D is a top view, while 7E is a cross-sectional view).
9. Etch the exposed silicon to a depth approximately equal to one-half the epitaxial layer 52 thickness using a solution which does not appreciably etch the mask 104 or mask 207 (See FIG. 7F).
10. Oxidize the silicon to the extent that the upper surface of silicon dioxide 208 corresponds approximately to the plane of the original silicon surface. The lower surface of the silicon dioxide film 208 should intersect the buried N+ layer 53. During this oxidation, N-type region 206 diffuses downward to meet the upward diffusing N+ buried layer 53 (FIG. 7G).
11. Remove mask 207 leaving mask 104 intact.
12. Reoxidize the wafer to grow a thin protective oxide layer 209 (FIG. 7H).
13. Use an oversized photoresist mask 212 to expose the silicon in emitter 210 and collector 211 contact regions. Etch through the layer 209 of the silicon dioxide (FIG. 7H).
14. Form with a P type impurity emitter region 213 and collector contact region 214. Remove the silicon dioxide 209 covering base contact region 206 (FIG. 7I).

15. Form metal contacts 216A, 216B and 216C (or contacts of any other suitable conductive material) to the emitter, base, and collector regions, respectively.

Figure 7I:
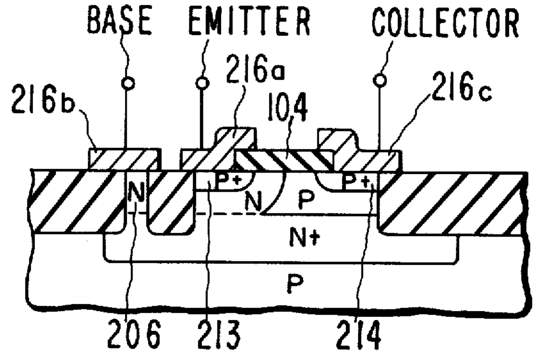

The resulting structure shown in cross-section in FIG. 7I, is similar to, and has the features and advantages of the structure shown in FIG. 2.

Figure 8:
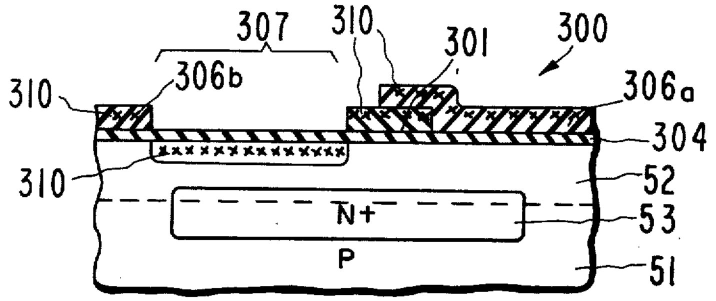
FIG. 8 shows a third process for forming the transistor structure of this invention.

A third process for fabricating the transistor structure of this invention utilizes ion implantation techniques. The steps of this process are as follows:

1. Follow steps 1–6 under the previously discussed first process. FIG. 8 shows the mask 304 of silicon nitride, epitaxial layer 52, N+ buried layer 53 and substrate 51 as they will appear at the completion of this step.

2. Using chemical vapor deposition (CVD) deposit a silicon dioxide layer 301 (FIG. 8) sufficiently thick to mask against the high energy ions which will later be used to implant impurities below the interface of mask 304 and silicon 52. (The CVD process is used as an example. Other processes utilizing other material could be used to form this layer.)

3. Etch away the silicon dioxide layer 301 from everywhere except where the transistor structure is desired. The mask 304 is not etched at this time.

4. Form a photoresist mask 306 (FIG. 8) over all regions of wafer 300 except those which are to receive the base impurity, that is, region 307. This layer is of sufficient thickness and density to prevent passage of impurity ions during ion implantation.

5. Implant the base N type impurity into the wafer 300 surface. The implant energy is selected to make the peak of the impurity distribution fall below mask layer 304 in region 310 of silicon 52. The mask layer 304 is not appreciably altered by this step. The peak of the implanted impurity distribution is shown as lines of crosses 310 in FIG. 8.

6. Remove photoresist layer 306.

7. Perform steps 8 through 15 of the second process (mask 304 of the third process functions as mask 207 of the second process, while mask 301 of the third process functions as mask 104 of the second process. Base region 310 of the third process is equivalent to base region 206 of the second process, except in the manner in which it is formed.

In summary, this invention provides several advantages over the prior art. Among these advantages are: first, the graded concentration profile of the base and the narrow base width resulting from the lateral, double-diffusion improve the high frequency operation of the transistor. Second, the self-aligning manufacturing characteristics of the transistor allow the masking tolerances to be increased and provide a corresponding reduction in device dimensions. Thus, the device packing density is increased. Third, the invention allows fabrication of complementary PNP/NPN lateral transistors within a given isolation area, thereby further increasing packing density of such circuits.

Lastly, it should be noticed that the invention is equally applicable to the manufacture of transistors and semiconductor devices of opposite conductivity types to those particular examples discussed herein. In other words, it should be understood that in FIG. 3, for example, the conductivity type of each material could be reversed, thereby forming an NPN transistor, rather than a PNP transistor. It should also be noted that while this invention has been discussed in conjunction with silicon semiconductor device technology, it is equally applicable to semiconductor devices formed from other materials.

This invention has been described as using a mask of a material such as silicon nitride which etches at a different rate in a given etch than does silicon dioxide. However, instead of using silicon nitride for the mask such as mask 56 (FIG. 2), silicon dioxide formed to a greater thickness than the adjacent layers of silicon dioxide formed on the device can be used as the mask. In this situation, mask 56 must be at least thick enough to allow the silicon dioxide on adjacent portions of the top surface of the wafer to be removed while still leaving a thick enough layer of silicon dioxide on the surface to mask the impurities to be diffused or otherwise placed in the underlying semiconductor material.

What is claimed is:

1. A method for fabricating a double-diffused, lateral transistor structure comprising the steps of:

a. oxidizing a p-type silicon substrate;

b. forming an opening in the silicon dioxide layer formed by step (a);

c. predepositing an $n^+$-type impurity in the portion of the substrate exposed by said opening and heating said substrate to thermally drive said $n^+$-type impurity into said substrate to form a buried layer;

d. removing the remaining silicon dioxide formed by step (a) from the surface of said substrate;

e. epitaxially forming a layer of p-type conductivity on said substrate;

f. forming a selectively etchable mask on the surface of said p-type epitaxial layer;

g. removing said mask from said surface of said p-type epitaxial layer except over a portion of the active transistor structure to be formed;

h. oxidizing the surface of the remaining exposed epitaxial layer to form an impurity-diffusion masking layer;

i. defining a base diffusion opening in the silicon dioxide material formed by step (h);

j. predepositing an n-type impurity in said epitaxial layer through said base diffusion opening;

k. removing the remaining silicon dioxide material formed by step (h);

l. applying a thermal oxidation masking material over said active transistor structure to be formed;

m. etching the portion of said epitaxial layer not covered by said thermal oxidation masking material to be approximately one-half its depth;

n. heating said epitaxial layer to oxidize said etched portion of said epitaxial layer so that the surface of the isolation-forming, thermally grown silicon dioxide corresponds approximately to the plane of the original surface of said epitaxial layer and so that said predeposited n-type impurities diffuse to meet said buried layer;

o. removing said thermal oxidation masking material applied by step (1);

p. reoxidizing said epitaxial layer to form a thin protective silicon dioxide layer;

q. defining said protective silicon dioxide layer formed by step (p) to form emitter and collector contact openings;

r. predepositing a p-type impurity in said epitaxial layer through said emitter and collector contact openings and heating said epitaxial layer to thermally drive said p-type impurities into said epitaxial layer to form emitter and collector regions, said emitter region stopping short of the diffusion front associated with said base region; and s. forming metal contacts to said emitter, base and collector regions.

2. A method for fabricating a double-diffused, lateral transistor structure in accordance with claim 1 wherein step (f) comprises forming a silicon nitride passivation mask on the surface of said p-type epitaxial layer.

3. A method for fabricating a double-diffused, lateral transistor structure in accordance with claim 2 wherein step (1) comprises applying silicon nitride masking material over said active transistor structure to be formed.

* * * * *